United States Patent [19]
Lee et al.

[11] Patent Number: 5,976,903
[45] Date of Patent: Nov. 2, 1999

[54] METHOD FOR MANUFACTURING TUNABLE LASER

[75] Inventors: Bun Lee; Jong Hyub Baek, both of Daejon-Shi, Rep. of Korea

[73] Assignee: Electronics and Telecommunications Research Institute, Daejon-Shi, Rep. of Korea

[21] Appl. No.: 09/020,711

[22] Filed: Feb. 9, 1998

[30] Foreign Application Priority Data

Feb. 10, 1997 [KR] Rep. of Korea ............ 97-3863

[51] Int. Cl.$^6$ ................................. H01L 21/00
[52] U.S. Cl. ................... 438/31; 372/45; 372/20
[58] Field of Search ................ 372/45, 50, 96, 372/20; 438/31, 32

[56] References Cited

U.S. PATENT DOCUMENTS

| | | | |
|---|---|---|---|
| 5,541,949 | 7/1996 | Bhat et al. | 372/45 |
| 5,748,665 | 5/1998 | Jiang et al. | 372/96 |
| 5,764,674 | 6/1998 | Hibbs-Brenner et al. | 372/45 |
| 5,774,487 | 6/1998 | Morgan | 372/45 |

OTHER PUBLICATIONS

Y. Tohmori et al., Over 100 nm Wavelength Tuning In Superstructure Grating (SSG) DBR Lasers, Feb. 18, 1993, pp. 352–354.

*Primary Examiner*—Brian Dutton
*Attorney, Agent, or Firm*—Cohen, Pontani, Lieberman & Pavane

[57] ABSTRACT

A method for making a surface-type semiconductor laser specially devised to keep the stability of the wavelength at the next generation laser for WDM, which does not cause a raising characteristic variation with time because the laser wavelength of the individual device can be controlled easily and exactly as required and the devices in which the wavelength control have completed is stable in their material properties. The surface-type semiconductor laser is made by growing the cladding layer within the active layer at a low temperature, growing the upper and the underlying superlattice mirror layers and the quantum well structure within the active layer at a high temperature and then sintering the structure thus formed at a high temperature.

2 Claims, 2 Drawing Sheets

METHOD FOR MANUFACTURING TUNABLE LASER

FIELD OF THE INVENTION

The present invention is concerned with a method for manufacturing a surface-type semiconductor laser with 1.55 micron bandwidth which can control a laser wavelength and is used as a core device for communication of a next generation Wave Division Multiplex (referred to as "WDM" hereinafter), and more particularly, to a method for manufacturing a tunable laser in which the active layer with an atomic ordering structure is sintered.

BACKGROUND OF THE INVENTION

A laser for WDM must be manufactured exactly the wavelength of which falls within 2 to 3 nm of the expected design clearance. However, since it is difficult to implement the epitaxial growth and the process thereof, the laser wavelength is easily distorted contrary to its expectation.

Accordingly, a method for controlling exactly the laser wavelength is required after the device is manufactured. The tunable laser known in the art typically controls the wavelength thereof by applying an electrical field thereto using unstable properties of matter so as to control its intensity continuously.

The next generation laser for WDM the wavelength of which is less than 2 to 3 nm in its variation can be used.

To be used for a WDM communication network in which lasers the emitting wavelengths of which are slightly different are combined together, controlling the wavelength of an individual laser must be simple and the laser wavelength must be stable against the surrounding environment and its oscillation applied thereto.

SUMMARY OF THE INVENTION

Therefore, the present invention is to provide a method for manufacturing a tunable laser the physical properties of the device structure is stable with no charge in time and also the variation due to the affect from the surrounding environment is very little after the lattice structure thereof is sintered and under-ordered at a stabilized ordering so as to vary the thickness of the cavity layer and then control its wavelength.

DESCRIPTION OF THE INVENTION

In the present invention, a laser thin structure is grown and then the degree of the wavelength variation is observed through a photoluminescence(referred to as "PL" hereinafter) analysis. Since some of the active layers have regular orderings and the phases thereof are separated, they are made irregularly in their lattices to be controlled through a high temperature treatment of the device as their laser waveforms expected.

Depending on the sintering temperature and time, the degree of the variation at the waveform can be expected. The control method thereof is very simple and the laser waveform once controlled through the sintering is very stable against the environment temperature and the oscillation time.

When a 3-order thin film layer having 3–5 group compound semiconductor are deposited on a substrate by means of the epitaxial growth method so that the lattice thereof is matched, it is general that the unordering lattice structure is made, and the bandgap thereof is expected to be about 1.56 eV. However, ordering of thin film layers such as InGaP, InGaAsP, InAlAs occurs under a specific growth condition. Ordering means that the bandgap is reduced due to an irregular arrangement of the lattices and thereby the optical properties of the lattices vary. In case of InAlAs thin film growth, the bandgap is further reduced because the phase separation may occur.

The present invention will be described in detail by reference to the accompanying drawings.

Figure 1:
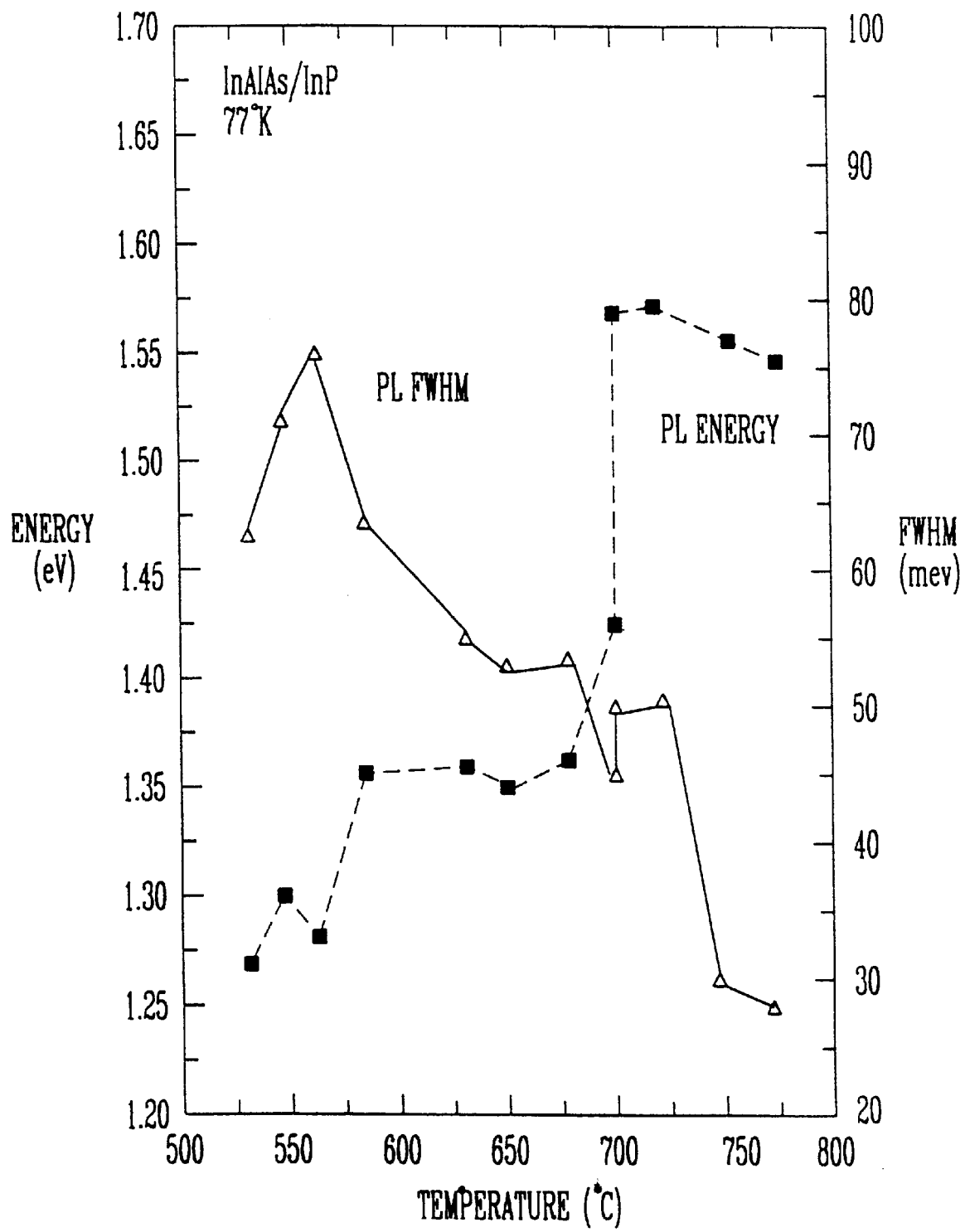
FIG. 1 shows a graph illustrating the variation in PL energy at a InAlAs/InP buffer layer in which lattices are matched depending on the growth temperature in accordance with the present invention.

FIG. 1 shows a graph illustrating the variation in PL energy at a InAlAs/InP buffer layer in which lattices are matched depending on the growth temperature in accordance with the present invention. This result is obtained by analyzing the PL at 77° K, in which the InAlAs layer is grown on the InP substrate depending on various temperature of the substrate. In the graph, it can be seen that the bandgap energy is increased and the PL FWHM is reduced. When $In(0.52)Al(0.48)As$ thin film layer in which the lattices thereof are matched on (100) InP substrate is grown by MOCVD epitaxial method at 535–750° C., the bandgap energy of the InAlAs thin film layer is varied depending on the growth temperature. The difference with the energy which has been reduced at the lowest growth temperature reaches to a maximum 300 mV. The major reason of this is caused due to the ordering between In and Al atoms along with a phase separation. The reduction at the bandgap energy due to the ordering is expected to be less 80 mV, and the other reduction at the energy is considered to be caused by the phase separation. The results of the structural analysis through the electronic microscope show that the phenomena of the compositional modulation is most significant and a vertical type $In(x)Al(1-x)As/In(y)Al(1-y)As$ superlattice shape is formed in the direction of the growth. When the InAlAs thin film sample in which the ordering and phase separation has occurred is sintered at high temperature of more than 750° C., an unordering effect of the lattice can be obtained in time due to free movement of In and Al atoms. Accordingly, the bandgap is gradually increased and the refractive index is reduced.

Figure 2:
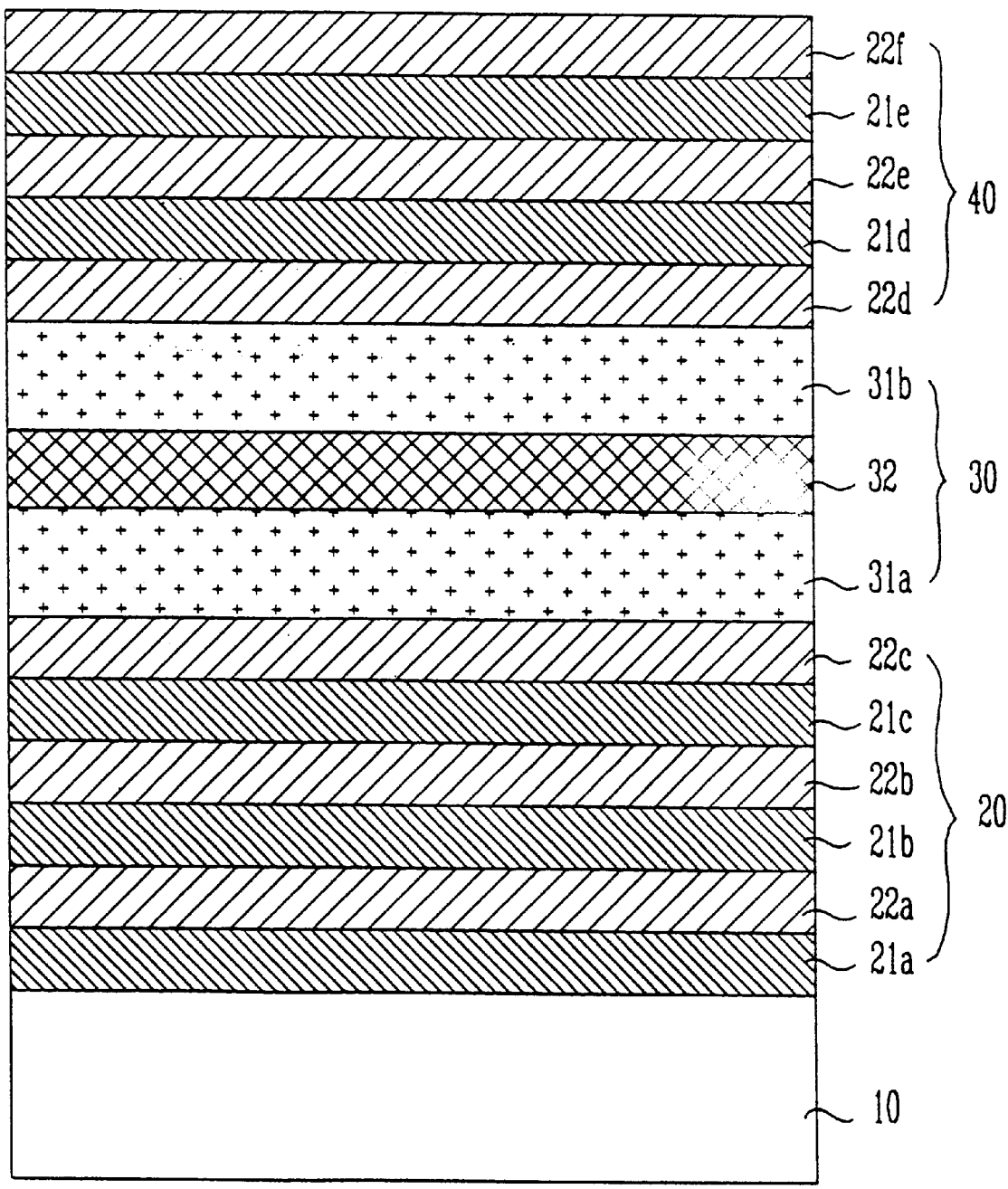
FIG. 2 shows a sectional view of a tunable laser in which the active layer with an atomic ordering structure is sintered in accordance with the present invention.

FIG. 2 shows a sectional view of a tunable laser in which the active layer having an atomic ordering structure is sintered in accordance with the present invention. As can be seen from the cross section of FIG. 2, it is consisted of a n-type underlying superlattice mirror layer 20 and an undoped active layer of $\lambda=1$ 30 and a p-type upper superlattice mirror layer 40 on a substrate 10. Also, the underlying and the upper superlattice mirror layers 40 and 20 have a structure in which InAlAs layers 21a through 21e and InGaAlAs layers 22a through 22f are interposed in turn therebetween, and the active layer 30 is comprised of a quantum well structure 32, a first electronic confinement layer 31a surrounding it and a second electronic confinement layer 31b. The first and the second electronic confinement layers 31a and 31b which act as barrier layers, are InAlAs thin film layers which are grown at low temperature of less 650° C. and the lattices of which are ordered. For a single wavelength laser oscillation, the thickness of the cavity layer consisting of the active layer 30 must be equal to the laser wavelength. Since the thickness of the cavity layer largely depends on the thickness of the barrier layer, the barrier layer is also referred to as a cladding layer. The emitting efficiency of the laser is largely dependent upon the reflectivity of the upper and the underlying superlattice mirror layer 20 and 40 but the wavelength of the laser is dependent on the thickness of the cavity layer rather than the quantum well structure 32 in the active layer 30. Accordingly, as a device structure for 1.55 micron laser, only the cladding layer within the active layer 30 is grown at a low temperature to form InAlAs or InGaAlAs thin film layers having lattice orderings and the effect of phase separation. The underlying and the upper superlattice mirror layers 20 and 40 and the quantum well structure 32 are grown at a high temperature to become unordered.

When the grown device structure is sintered at a high temperature, not only the InAlAs cladding layer within the active layer 30 has an unordered lattice structure but also the bandgap and the refractive index vary. Since the extent that varies depending on the sintering temperature and time changes, the thickness of the optical cavity layer can be exactly controlled. The thickness of the cavity layer which is controlled by such method can change exactly the wavelength of the laser. As the properties of the materials in the device structure in which a laser wavelength is controlled by a sintering method, is fundamentally varied, the characteristic of the wavelength with time is very stable.

As discussed above, the present invention has an outstanding effect that it does not cause a raising characteristic variation with time because the laser wavelength of an individual device can be easily and exactly controlled as required and the devices in which the wavelength control have completed is stable in their material properties.

We claim:

1. A method for making a tunable laser comprising the steps of:

(a) growing a first superlattice mirror layer on a semiconductor substrate;

(b) growing a first electronic confinement layer on the first superlattice mirror layer;

(c) growing a quantum well structure layer on the first electronic confinement layer;

(d) growing a second electronic confinement layer on the quantum well structure layer;

(e) growing a second superlattice mirror layer on the second electronic confinement layer so as to produce a structure; and (f) sintering the structure thus formed by steps (a) through (e) at a temperature greater than approximately 750° C.

2. The method in accordance with claim 1, wherein the first and second electronic confinement layers comprises InAlAs.

* * * * *